(12) United States Patent
Tawada et al.

(10) Patent No.: US 6,388,301 B1
(45) Date of Patent: May 14, 2002

(54) SILICON-BASED THIN-FILM PHOTOELECTRIC DEVICE (75) Inventors: Yuko Tawada, Akashi; Akihiko Nakajima, Himeji; Masashi Yoshimi, Kobe, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/600,026
(22) PCT Filed: May 31, 1999
(86) PCT No.: PCT/JP99/02882
§ 371 Date: Jul. 11, 2000
§ 102(e) Date: Jul. 11, 2000
(87) PCT Pub. No.: WO99/63600
PCT Pub. Date: Dec. 9, 1999

(30) Foreign Application Priority Data

Jun. 1, 1998 (JP) ............................................ 10-151049

(51) Int. Cl.[7] .......................................... H01L 31/0232
(52) U.S. Cl. ........................................ 257/436; 438/48
(58) Field of Search ................................ 136/256, 259, 136/249; 257/436, 458

(56) References Cited

U.S. PATENT DOCUMENTS

| 4,532,537 A | | 7/1985 | Kane | |
|---|---|---|---|---|
| 4,694,116 A | * | 9/1987 | Hayashi et al. | 136/256 |
| 4,808,462 A | | 2/1989 | Yaba et al. | |
| 5,244,509 A | * | 9/1993 | Arao et al. | 136/259 |
| 5,282,902 A | * | 2/1994 | Matsuyama | 136/249 |
| 5,370,747 A | * | 12/1994 | Noguchi et al. | 136/259 |
| 5,500,055 A | * | 3/1996 | Toyama et al. | 257/436 |
| 5,549,763 A | | 8/1996 | Sano et al. | |
| 5,589,403 A | * | 12/1996 | Toyama et al. | 257/436 |
| 6,177,711 B1 | * | 1/2001 | Kariya | 257/458 |

FOREIGN PATENT DOCUMENTS

| JP | A62209872 | 9/1987 |
|---|---|---|
| JP | A63313874 | 12/1988 |
| JP | A399477 | 4/1991 |
| JP | A494173 | 3/1992 |
| JP | A7263731 | 10/1995 |
| JP | A7283432 | 10/1995 |
| JP | A7321359 | 12/1995 |
| JP | A10117006 | 5/1998 |

OTHER PUBLICATIONS

K. Yamamoto et al., Materials Research Society Symposium Proceedings, vol. 507, pp. 131–138 (Apr. 14, 1998).

* cited by examiner

Primary Examiner—David Nelms
Assistant Examiner—Bau T Le
(74) Attorney, Agent, or Firm—Birch, Stewart, Kolasch & Birch, LLP (57) ABSTRACT

A silicon-based thin film photoelectric conversion device includes a substrate 1, a back electrode 10 having a light reflecting metal film 102, at least one silicon-based photoelectric conversion unit 11 and a front transparent electrode 2, wherein at least one of the light reflecting metal film 102 and the front transparent electrode 2 has that surface thereof closer to the silicon-based photoelectric conversion unit provided with convexities and concavities having a level difference therebetween in a range of 0.01 to 2 μm and a pitch greater than the level difference and no more than 25 times the level difference.

12 Claims, 4 Drawing Sheets

SILICON-BASED THIN-FILM PHOTOELECTRIC DEVICE

This application is the national phase under 35 U.S.C. §371 of PCT International Application No. PCT/JP99/02882 which has an International filing date of May 31, 1999, which designated the United States of America.

TECHNICAL FIELD

The present invention relates to thin film photoelectric conversion devices and particularly to reducing the cost for and improving the performance of the silicon-based thin film photoelectric conversion devices.

BACKGROUND ART

In recent years, there has been a vigorous development of a photoelectric conversion device employing a silicon thin film, particularly that containing crystalline silicon such as polycrystalline silicon and microcrystalline silicon. In this development a low-temperature process is employed to form a crystalline-silicon thin film of good quality on an inexpensive substrate, attempting to reduce the cost for and enhance the performance of the device, and this development is expected to be applied to not only solar batteries but optical sensors and other various photoelectric conversion devices. Incidentally, it should be noted that throughout the present specification, the terms "polycrystalline", "microcrystalline" and "crystalline" are used not only for meaning a completely crystalline state but also for meaning a "partially amorphous" state, as commonly used in the technical field of thin film photoelectric conversion devices.

When a photoelectric conversion layer is a thin film, it insufficiently absorbs light in a longer wavelength range in which it has a small light absorption coefficient and it will thus have a limited level of photoelectric conversion that is attributed to its small thickness. Particularly in case of a photoelectric conversion layer including crystalline silicon, it does not cause sufficient light absorption. As such, to more efficiently utilize light incident on a photoelectric conversion unit including a photoelectric conversion layer, a photoelectric conversion unit is provided on its back side with a highly reflective metal layer having an uneven surface (a textured surface) to scatter and reflect light back into the photoelectric conversion unit.

Furthermore, on the light incidence side there is also provided a transparent electrode having an uneven surface (a textured surface) to scatter light into the photoelectric conversion unit and also to irregularly reflect again the light reflected from the metal electrode. Photoelectric conversion devices including a transparent electrode having a surface textured as above are disclosed for example in Japanese Patent Laying-Open Nos. 59-61973 and 7-283432, in which it is mentioned that the photoelectric conversion efficiency can be improved.

A silicon-based photoelectric conversion unit, as typically used in a thin film polycrystalline silicon solar battery, includes a photoelectric conversion layer formed of a silicon-based thin film, and conductivity types layers sandwiching the conversion layer. The conductivity type layers are doped with impurities, which absorb light and thus reduce the light incident on the photoelectric conversion layer. To decrease the quantity of light absorbed by such impurities and increase the light incident on the photoelectric conversion layer, it is preferred to reduce the thickness of the conductivity type layers within their permissible reduction range.

Under the condition as above, the present inventors have found that when a front transparent electrode and a back electrode each have an uneven surface capable of providing a preferable irregular reflection to allow a photoelectric conversion layer to absorb more light, thin film conductivity type layers in the photoelectric conversion unit that are in contact with the electrodes can have mechanical and electrical defects and the obtained solar battery can disadvantageously have a reduced open-circuit voltage or be short-circuited, resulting in a reduced yield thereof.

To overcome such disadvantages of the prior art found by the present inventors, the present invention contemplates a silicon-based thin film photoelectric conversion device allowed to use an inexpensive substrate and fabricated merely through a low-temperature process, capable of utilizing light confinement to provide an enhanced photoelectric conversion characteristic while neither its open-circuit voltage nor its production yield are reduced.

DISCLOSURE OF THE INVENTION

The present inventors studied hard to overcome the disadvantages found as above and have found that when a silicon-based thin film photoelectric conversion device includes a photoelectric conversion unit having semiconductor junctions formed by semiconductor layers all provided through plasma chemical vapor deposition (plasma CVD) at low temperature, a back electrode or a front transparent electrode can have a surface closer to the photoelectric conversion unit having an uneven texture controlled in level and pitch to enhance the thin film photoelectric conversion device in performance, achieving a high open-circuit voltage and allowing the photoelectric conversion layer to absorb a larger quantity of light.

More specifically, in the present invention a silicon-based thin film photoelectric conversion device includes a substrate, a back electrode having a light reflecting metal film, at least one silicon-based photoelectric conversion unit, and a front transparent electrode, wherein at least one of the light reflecting metal film and the front transparent electrode has a surface closer to the silicon-based photoelectric conversion unit having an uneven texture with a level difference in a range of 0.01 to 2 $\mu$m and a pitch larger than the level difference and no more than 25 times the level difference. It should be noted that a level difference on a surface means an average of differences in altitude between convex portions and concave portions and that a pitch means an average of distances between adjacent convex portions or adjacent concave portions.

In the present invention, a silicon-based thin film photoelectric conversion device may have a light reflecting metal film having a surface closer to the silicon-based photoelectric conversion unit having an uneven texture with a level difference of 0.01 to 2 $\mu$m and a pitch larger than the level difference and no more than 25 times the level difference.

Furthermore, a silicon-based thin film photoelectric conversion device may have a front transparent electrode having a surface closer to the silicon-based photoelectric conversion unit having an uneven texture with a level difference of 0.01 to 2 $\mu$m and a pitch larger than the level difference and no more than 25 times the level difference.

These solar batteries may be a silicon-based thin film photoelectric conversion device having a light reflecting metal film and a front transparent electrode each having a surface closer to the silicon-based photoelectric conversion unit having an uneven texture with a level difference of 0.01 to 2 $\mu$m and a pitch larger than the level difference and no more than 25 times the level difference.

Preferably, the light reflecting metal film or the front transparent electrode has a surface closer to the silicon-based photoelectric conversion unit having an uneven texture substantially not including bent points at which slopes of curves are discontinuously changed.

Furthermore, preferably, the light reflecting metal film or the front, transparent electrode has a surface closer to the silicon-based photoelectric conversion unit having an uneven texture substantially free bent points at which slopes of curves are discontinuously changed.

In recent years, it has often been tried to form a photoelectric conversion device with a silicon-based photoelectric conversion unit deposited on a back electrode including a metal layer and a transparent conductive layer of oxide such as zinc oxide (ZnO), as disclosed for example in Japanese Patent Laying-Open Nos. 3-99477 and 7-263731; IEEE 1st World Conf. on Photovoltaic Energy Conversion, p. 405 (1994); and Applied Physics Letters, Vol. 70, p.2975 (1997). The transparent conductive oxide layer interposed between the back electrode's metal layer and the silicon-based photoelectric conversion unit can alleviate a thermal distortion attributed to the difference between their thermal expansion coefficients and also prevent the metal atoms from diffusing into and mixing with the silicon-based photoelectric conversion unit. Thus, the obtained photoelectric conversion device can be improved in yield and reliability as well as in photosensitivity and hence photoelectric conversion characteristics. In the present invention also, a transparent conductive oxide film may be provided between the light reflecting metal film and the silicon-based photoelectric conversion unit.

The present invention can remarkably effectively operate when at least one of photoelectric conversion units includes a layer of a first conductivity type, a crystalline silicon-based photoelectric conversion layer, and a layer of an opposite conductivity type.

In the present invention, preferably the photoelectric conversion device includes a metal film having a high reflectance reflecting no less than 95% of a light having a wavelength in a range of 500 to 1200 nm.

More specifically, the metal layer is preferably formed of one selected from the group of Ag, Au, Al, Cu and Pt or an alloy containing the same.

If a transparent, conductive oxide film is interposed between the light reflecting metal film and the silicon-based photoelectric conversion unit, it is preferable that the metal film's interface with the transparent, conductive oxide film be formed of one selected from the group of Ag, Au, Al, Cu and Pt or an alloy containing the same.

If a crystalline silicon-based photoelectric conversion layer is used, preferably it is formed at a substrate temperature of at most 400° C. and it has a crystallized volume fraction of at least 80%, a hydrogen content in a range of 1 to 30 at. %, a thickness of 0.5 to 20 $\mu$m, a preferential crystal orientation plane of (110) parallel to its film surface, and an x-ray diffraction intensity ratio of no more than 0.2 as a ratio of a (111) diffraction peak to (220) diffraction peak ratio.

Furthermore, in the present invention a photoelectric conversion device may include a photoelectric conversion unit including a crystalline silicon-based photoelectric conversion layer plus at least one of photoelectric conversion units including an amorphous silicon-based photoelectric conversion layer and stacked in tandem.

In the present invention, a silicon-based photoelectric conversion device may have a back electrode having a light reflecting metal film, at least one silicon-based photoelectric conversion unit, and a front transparent electrode stacked in this order on a substrate.

BEST MODES FOR CARRYING OUT THE INVENTION

Figure 1:
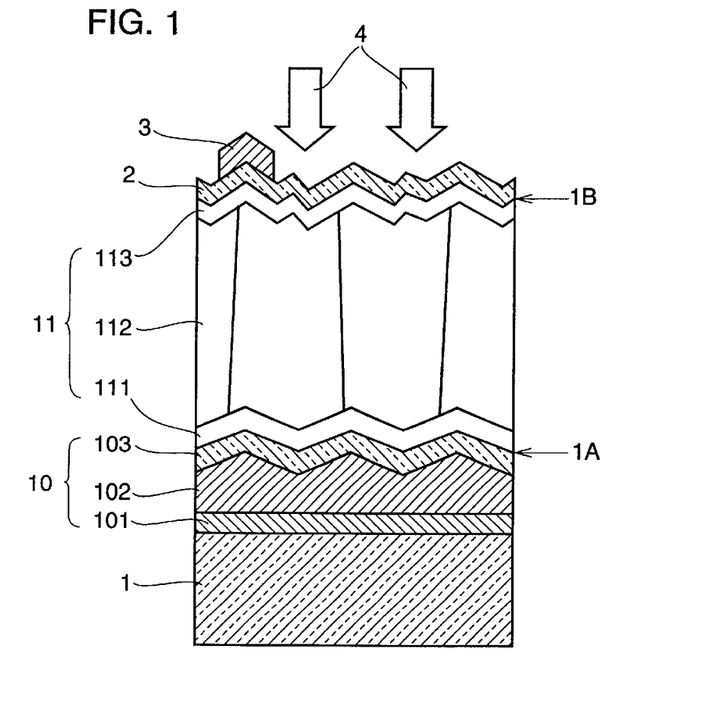
FIG. 1 is a schematic cross section for illustrating a silicon-based thin film photoelectric conversion device according to a first embodiment of the present invention.

Reference is now made to a schematic cross section provided in FIG. 1 to describe a silicon-based thin film photoelectric conversion device according to a first embodiment of the present invention. The photoelectric conversion device may include a substrate 1 formed for example of metal such as stainless steel, organic film, ceramic, or an inexpensive glass having a low softening point.

On substrate 1, a back electrode 10 is provided in the form of a light reflecting metal film 102. Preferably, back electrode 10 is a composite layer including light reflecting metal film 102 and a transparent conductive oxide film 103. Light reflecting metal film 102 may be provided on substrate 1, e.g., through vacuum vapor deposition or sputtering on substrate 1. Preferably, reflective metal film 102 is formed of one selected from Ag, Au, Al, Cu and Pt or an alloy containing the same. For example, on a glass substrate 1 a highly reflective Ag layer 102 may be provided through vacuum vapor deposition, with a substrate temperature in a range of 100 to 330° C., preferably 200 to 300° C. Furthermore, a Ti layer 101 of 20 to 50 nm thickness may be inserted between glass substrate 1 and Ag layer 102 to enhance adherence therebetween. Ti layer 102 may also be provided through vapor deposition or sputtering. Preferably, transparent conductive oxide film 103 is zinc oxide.

Reflective metal film 102 has an upper uneven surface, which may be formed for example by previously etching a surface of substrate 1 to provide the surface with convexities and concavities and then providing a thin metal film 102 having an upper uneven surface transferred from the convexities and concavities. Alternatively, a transparent conductive oxide layer (not shown) having an uneven surface including convexities and concavities may be deposited on substrate 1 and a thin metal film 102 may then be provided having an upper uneven surface transferred from the convexities and concavities.

The convexities and concavities on the surface of light reflecting metal layer 102 have a level difference in a range of 0.01 to 2 $\mu$m and a pitch larger than the level difference and no more than 25 times the level difference. Preferably the convexities and concavities have a level difference of 0.01 to 1μ, more preferably 0.01 to 0.5μ, and still more preferably 0.02 to 0.1μ. Preferably the convexities and concavities have a pitch in a specific range of 0.3 to 1μ, more preferably 0.5 to 0.8μ. Furthermore, preferably cross sections of the convexities and concavities are free of any acute protrusion and still preferably they are substantially free of any bent points in slopes. Such convexities and concavities can be measured for example by obtaining a TEM (Transmission Electron Microscope) image of metal film 102 in cross section or observing a surface of the film with an AFM (Atomic Force Microscope).

If reflective metal film 102 has an uneven surface with convexities and concavities having a level difference too large relative to their pitch, concave portions and convex portions form acute angles and a silicon-based photoelectric conversion unit stacked thereon would include insufficient semiconductor junction portions, resulting in a reduced open-circuit voltage of a resultant photoelectric conversion device as a final product and a reduced yield thereof. In other words, it has been found that a high open-circuit voltage can be obtained if reflective metal film 102 has an uneven surface with convexities and concavities optimal in level difference and pitch, to have a pitch sufficiently large relative to their level difference to allow convex portions and concave portions to form less acute angles. Based on this finding, light reflecting metal layer 102 can be provided on its surface with convexities and concavities having such a level difference and a pitch as defined by the present invention to achieve improved light confinement to provide a photoelectric conversion device of high performance without reducing its open-circuit voltage and yield.

On light reflecting metal film 102, transparent conductive oxide film 103 is formed preferably of at least one layer selected from the group for example of ITO, $SnO_2$, and ZnO, and more preferably of a film containing ZnO as a main component. Transparent conductive oxide film 103, arranged adjacent to photoelectric conversion unit 11, preferably has an averaged crystal grain size of at least 100 nm and to meet this condition it is desirable that transparent conductive oxide film 103 be formed with a substrate temperature in a range of 100 to 450° C. It should be noted that it is preferable that transparent conductive oxide film 103 including ZnO as its main component has a thickness in a range of 50 nm to 1 μm and a specific resistance no more than $5\times10^{-3}$ Ωcm.

On back electrode 10 is provided silicon-based photoelectric conversion unit 11. Photoelectric conversion unit 11 includes semiconductor layers, all of which are deposited through a plasma CVD, with a substrate temperature of no more than 400° C. The plasma CVD may be a well-known parallel plate RF plasma enhanced CVD or it may be a plasma CVD using a high frequency power supply of the RF band to the VHF band of no more than 150 MHz.

On back electrode 10 a first conductivity type layer 11 included in photoelectric conversion unit 11 is initially deposited. The first conductivity type layer 11 may for example be an n-type silicon-based thin film doped with phosphorus as conductivity-type determining dopant or a p-type silicon-based thin film doped with boron. However, the first conductivity type layer 111 is not limited thereto and dopant atoms for an n-type layer may be nitrogen etc. The first conductivity type layer 111 may be formed of amorphous silicon; an alloy for example of amorphous silicon carbide or amorphous silicon germanium; as well as polycrystalline silicon; partially amorphous microcrystalline silicon; or an alloy thereof. It should be noted that if desired, the first conductivity type layer 111 deposited may be irradiated with a pulsed laser beam to control its crystallized volume fraction and carrier concentration due to conductivity-type determining dopant.

On the first conductivity type layer 111 an amorphous or crystalline silicon-based thin film is deposited as a photoelectric conversion layer 112. Crystalline silicon-based photoelectric conversion layer 112 may be a polycrystalline silicon thin film of non-doped intrinsic semiconductor, a microcrystalline silicon film having a crystallized volume fraction of at least 80%, or a silicon-based thin film of a weak p- or n-type containing a small amount of dopant and providing sufficient photoelectric conversion. However, photoelectric conversion layer 112 is not limited thereto and it may be formed of an alloy for example of silicon carbide and silicon germanium.

Such a photoelectric conversion layer 112 has a thickness in a range of 0.1 to 20 μm. If it is amorphous silicon-based thin film photoelectric conversion layer 112, then it has a thickness preferably in a range of 0.1 to 2 μm and more preferably 0.15 to 0.5 μm. If photoelectric conversion layer 112 is a crystalline silicon-based thin film, then it requires a sufficient thickness in a range of 0.5 to 20 μm. Since crystalline photoelectric conversion layer 112 is formed at a low temperature no more than 400° C., it contains a large number of hydrogen atoms which terminate or inactivate defects in crystal boundaries or crystal grains, and its hydrogen content is in a range of 1 to 30 at. %. Preferably, crystalline silicon-based thin film photoelectric conversion layer 112 includes most of crystal grains growing columnar upward from its underneath, and it has a preferential crystal orientation plane of (110) parallel to its film surface and has an x-ray diffraction intensity ratio of no more than 0.2 as a (111) diffraction peak to (220) diffraction peak ratio.

On photoelectric conversion layer 112, a silicon-based thin film 113 is deposited to have a conductivity type opposite to the type of the first conductivity type layer 111. The opposite conductivity type layer 113 may for example be a p-type silicon-based thin film doped with boron as conductivity-type determining dopant or an n-type silicon-based thin film doped with phosphorus, though preferably it is a p-type silicon-based thin film. However, the opposite conductivity type layer 113 is not limited thereto and dopant atoms for a p-type layer may be aluminum etc. Furthermore, the opposite conductivity type layer 113 may be formed of amorphous silicon or an alloy such as amorphous silicon carbide or amorphous silicon germanium, or it may be formed of polycrystalline silicon or partially amorphous microcrystalline silicon or an alloy thereof.

If back electrode 10 has even a substantially flat surface 1A and photoelectric conversion unit 11 deposited thereon includes a crystalline photoelectric conversion layer, unit 11 has an upper surface 1B textured with fine unevenness. If back electrode 10 has an upper surface 1A textured with unevenness, the photoelectric conversion unit's upper surface 1B is textured with fine unevenness smaller in pitch than the back electrode's upper surface 1A, since crystalline photoelectric conversion layer 112 in photoelectric conversion unit 11 naturally causes its textured uneven surface structure when it is deposited. Thus, photoelectric conversion unit 11 has upper surface 1B textured with fine unevenness suitable for scattering incident light of a wide wavelength range and also allowing the photoelectric conversion device of interest to confine more light therein.

After photoelectric conversion unit 11 is completely deposited, a transparent conductive oxide film including at least one layer selected from ITO, $SnO_2$, ZnO is provided as a front transparent electrode 2. When photoelectric conversion unit 11 has a surface textured with unevenness, convexities and concavities according to the unevenness on the unit's surface are formed in that surface of front transparent electrode 2 closer to the photoelectric conversion unit 11. Furthermore, front transparent electrode 2 itself also tends to produce convexities and concavities in its surface when it deposits. Preferably, that surface of front transparent electrode 2 closer to the photoelectric conversion unit has convexities and concavities having a level difference in a range of 0.01 to 2 μm and a pitch larger than the level difference and no more than 25 times the level difference.

It should be noted that the present invention effectively operates when in the first embodiment of the present invention either one or both of reflective metal film 102 and front transparent electrode 2 has/have convexities and concavities having the above mentioned level difference and pitch. For the FIG. 1 thin film photoelectric conversion device, the present invention operates most effectively if reflective metal film 102 has convexities and concavities having the above level difference and pitch. In this example, front transparent electrode 2 preferably has convexities and concavities having the same level difference and pitch as reflective metal film 102 or finer convexities and concavities than reflective metal film 102.

Furthermore, a metal electrode 3 as a grid electrode in the form of a comb including a layer of at least one selected from Al, Ag, Au, Cu and Pt or an alloy thereof is provided on front transparent electrode 2 to complete a photoelectric conversion device. In using such a silicon-based thin film photoelectric conversion device, light to be photoelectrically converted 4 illuminates the device at front transparent electrode 2.

Figure 2:
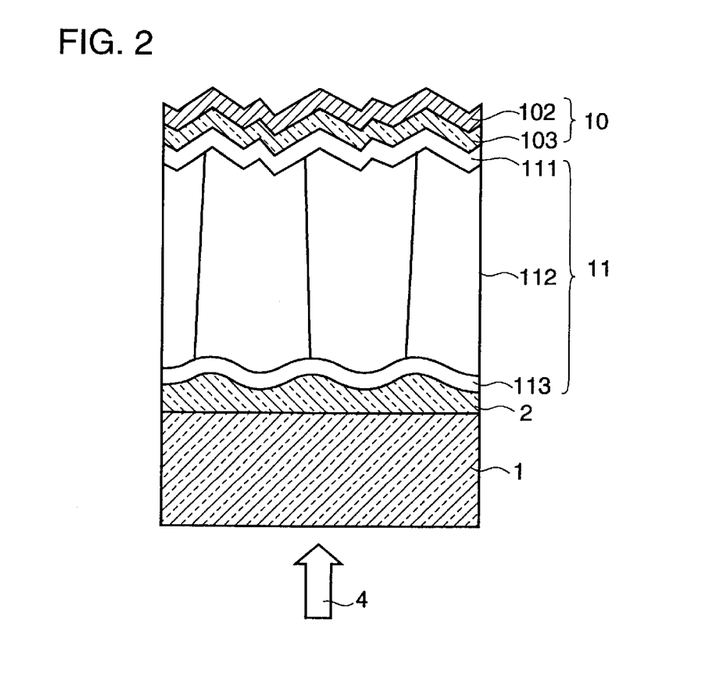
FIG. 2 is a schematic cross section for illustrating a silicon-based thin film photoelectric conversion device according to a second embodiment of the present invention.

FIG. 2 shows a silicon-based thin film photoelectric conversion device according to a second embodiment as an alternative to the first embodiment shown in FIG. 1. It should be noted that in FIGS. 1 and 2, like reference numbers denote like portions. For the FIG. 2 thin film photoelectric conversion device, front transparent electrode 2 is provided on transparent substrate 1 of glass etc. Light to be photoelectrically converted 4 is incident on transparent substrate 1. Front transparent electrode 2 may be formed of a transparent conductive oxide film including at least one layer selected from ITO, $SnO_2$ and ZnO. Of such materials, $SnO_2$ is particularly suitable in view of transmittance, conductivity and chemical stability and ITO is also suitable in view of workability, conductivity and transmittance. Transparent electrode 2 may be provided on substrate 1 for example through vacuum vapor deposition or thermal CVD or sputtering on substrate 1. On front transparent electrode 2 is provided silicon-based thin film photoelectric conversion unit 11. Photoelectric conversion unit 11 may be similar to the FIG. 1 photoelectric conversion unit. Conductivity layer 113 on the light incidence side is preferably of p-type.

On photoelectric conversion unit 11, light reflecting metal film 102 is provided as back electrode 10, though preferably back electrode 10 is a composite film including light reflecting metal film 102 and transparent conductive oxide film 103. That is, back electrode 10 in the present embodiment may be similar to that shown in FIG. 1.

For the FIG. 2 thin film photoelectric conversion device, the present invention operates most effectively when that surface of front transparent electrode 2 closer to photoelectric conversion unit 11 has convexities and concavities having a level difference in a range of 0.01 to 2 μm and a pitch larger than the level difference and no more than 25 times the level difference. In this example, reflective metal film 102 preferably has convexities and concavities similar in level difference and pitch to front transparent electrode 2 or has finer convexities and concavities than front transparent electrode 2.

In order for the front transparent electrode to have a surface with such concavities an convexities, a surface of substrate 1 may for example be etched to have convexities and concavities and thereon a thin transparent electrode 2 may be formed to have a surface provided with convexities and concavities along those of substrate 1. Alternatively, a transparent electrode layer having a surface provided with steep convexities and concavities may be initially deposited on substrate 1 and for example in a reducing atmosphere it may be etched or processed with plasma, electron-beam, corona or the like and thus processed to have a desired gentle convexities and concavities. Alternatively, on an underlying layer of $SnO_2$ having a surface provided with steep convexities and concavities, another conductive layer such as of ZnO may be provided to obtain a surface with gentle convexities and concavities.

For example, initially with underlying substrate 1 having a temperature set to approximately no less than 350° C., preferably approximately 450 to 550° C., and with $SnCl_4$, $O_2$, $CH_3OH$, HF, $H_2O$ or the like used as a source material, atmospheric-pressure thermal CVD is employed to form transparent electrode 2 of $SnO_2$. For $SnO_2$, varying the substrate temperature and the amount of each source material introduced during atmospheric-pressure thermal CVD can adjust the convexities and concavities on the surface of the electrode to some extent. Furthermore, after on the $SnO_2$ layer a Zn layer is provided through vapor deposition, the $SnO_2$ layer may be etched with HCl or the like to obtain a surface having desired gentle convexities and concavities. Such convexities and concavities can be adjusted by varying the amount of vapor-deposited Zn and varying the amount of the etching.

Figure 3:
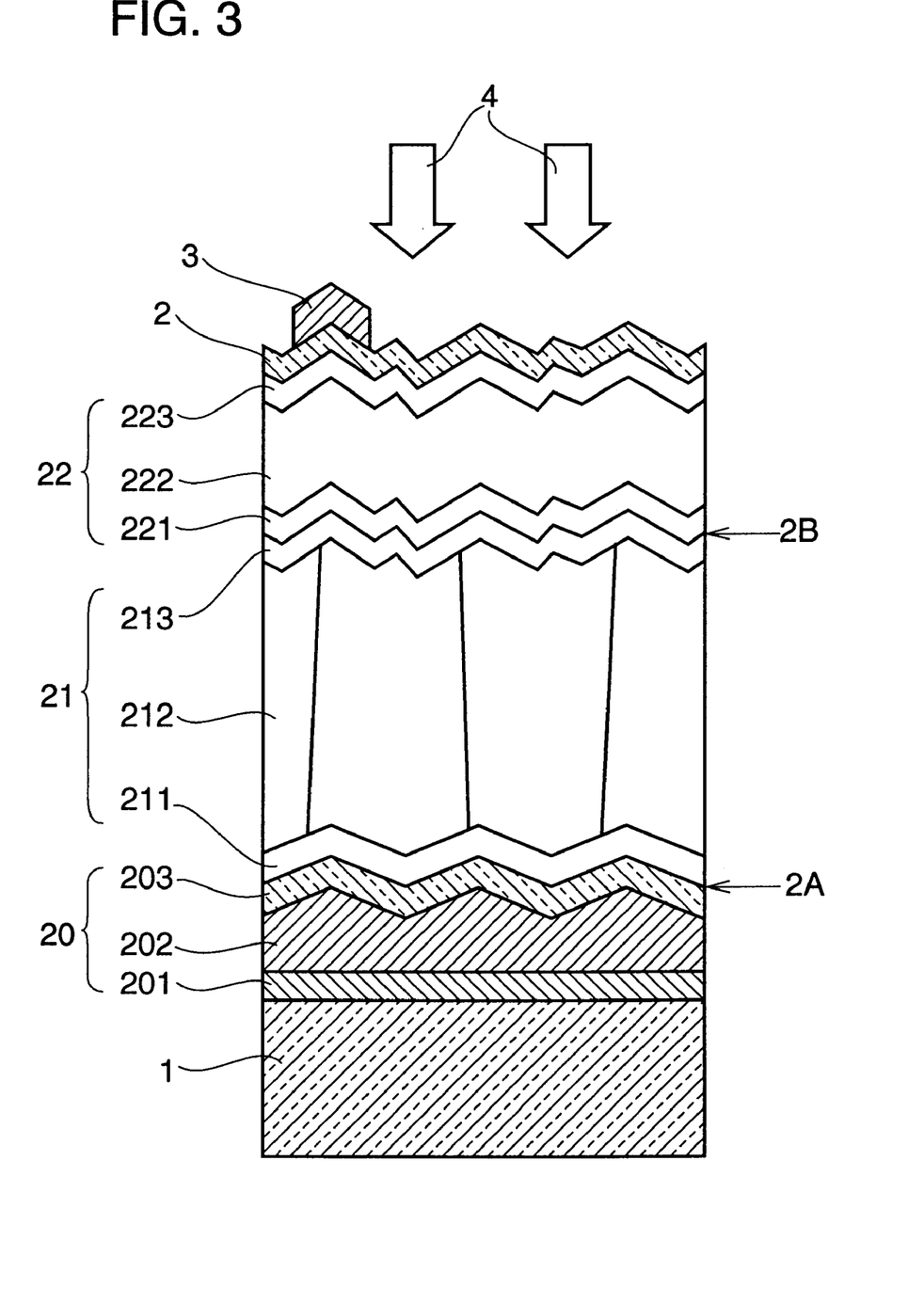
FIG. 3 is a schematic cross section for illustrating an amorphous-crystalline type tandem, silicon-based thin film photoelectric conversion device according to a third embodiment of the present invention.

Reference is now made to a schematic cross section shown in FIG. 3 to describe a tandem silicon-based thin film photoelectric conversion device according to a third embodiment of the present invention. The FIG. 3 device has on a substrate 1 multiple layers 201 to 203 and 211 to 213, which correspond to multiple layers 101 to 103 and 111 to 113 on substrate 1 shown in FIG. 1 and are thus similarly provided.

Furthermore, the tandem photoelectric conversion device shown in FIG. 3 uses a first unit 21 including a crystalline silicon-based photoelectric conversion layer as a rear photoelectric conversion unit and a second unit 22 stacked thereon as a front photoelectric conversion unit. The second photoelectric conversion unit 22 includes a microcrystalline or amorphous silicon-based thin film 221 of a first conductivity type, an amorphous silicon-based thin film photoelectric conversion layer 222 substantially of intrinsic semiconductor, and a microcrystalline or amorphous silicon-based thin film 223 of the opposite conductivity type which are successively provided through plasma CVD. On the second photoelectric conversion unit 22 are provided front transparent electrode 2 and metal electrode 3 in the form of a comb as provided similarly as in FIG. 1 to complete the tandem photoelectric conversion device as shown in FIG. 3.

Figure 4:
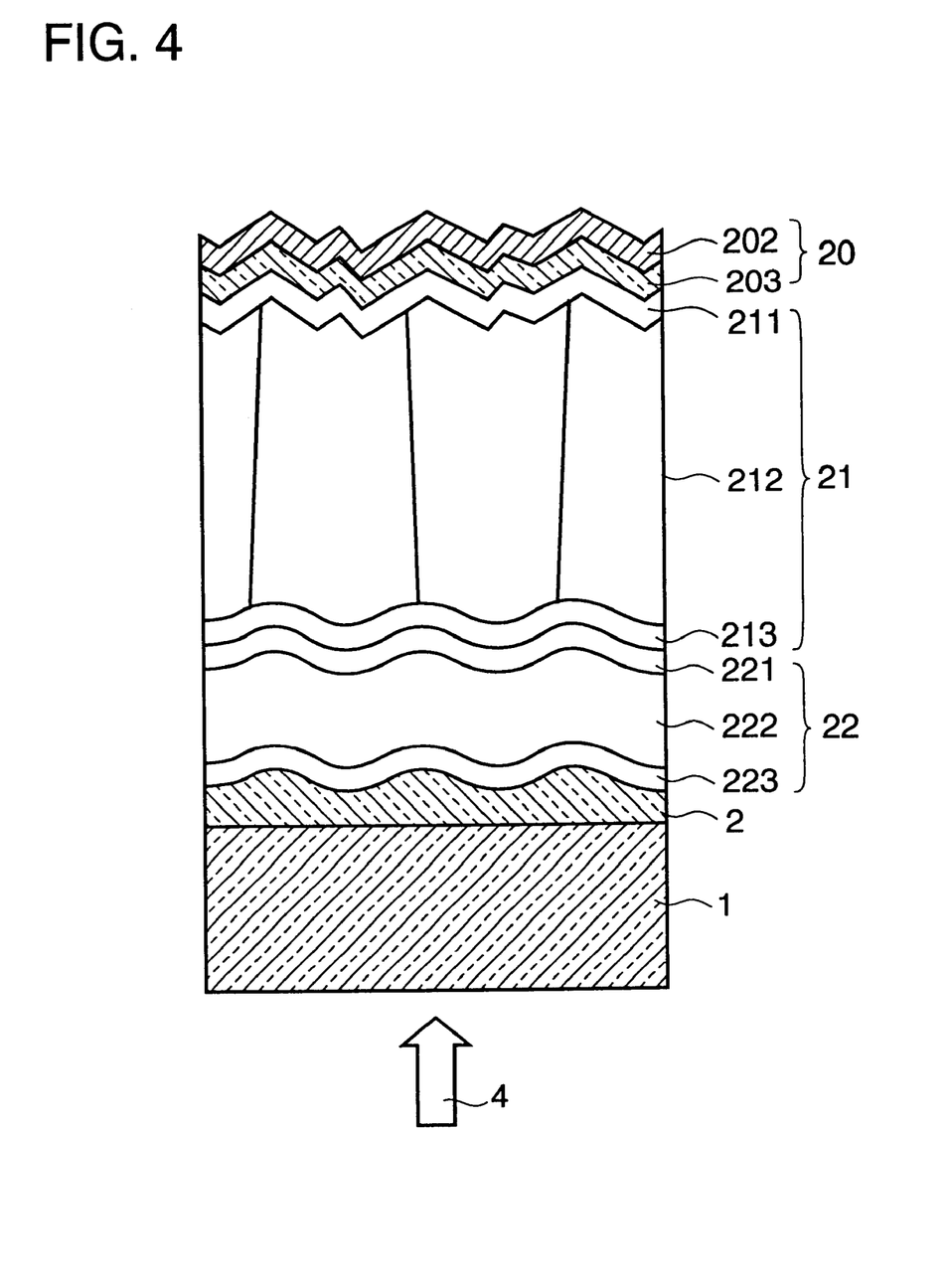
FIG. 4 is a schematic cross section for illustrating an amorphous-crystalline type, tandem, silicon-based thin film photoelectric conversion device according to a fourth embodiment of the present invention.

FIG. 4 shows a tandem photoelectric conversion device according to a fourth embodiment alternative to the FIG. 3 device according to the third embodiment. The FIGS. 3 and 4 photoelectric conversion devices have therebetween a relationship similar to that which the FIGS. 1 and 2 devices have therebetween and in FIGS. 3 and 4 like reference numbers denote like portions.

Hereinafter, silicon-based thin film photoelectric conversion devices as examples of the present invention will be described together with photoelectric conversion devices as comparative examples.

THE FIRST EXAMPLE

Corresponding to the first embodiment described with reference to FIG. 1, a silicon-based thin film photoelectric conversion device was fabricated as a first example. In the first example, on a glass substrate 1 a back electrode 10 is formed. Back electrode 10 includes a Ti layer 101 of 20 nm thickness, an Ag layer 102 of 300 nm thickness and a ZnO layer 103 of 100 nm in thickness which are deposited successively. Of such layers, Ag layer 102, serving as a light reflecting metal film, was provided through vacuum vapor deposition. On back electrode 10 was provided a silicon-based thin film photoelectric conversion unit 11 including an n-type layer 111, a non-doped crystalline silicon-based photoelectric conversion layer 112 and a p-type layer 113 which were provided through plasma CVD. On photoelectric conversion unit 11 a transparent conductive ITO film of 80 nm thickness was provided as a front electrode 2 and thereon an Ag electrode 3 in the form of a comb was provided for current extraction.

In providing photoelectric conversion unit 11, non-doped crystalline silicon-based photoelectric conversion layer 112 was provided through RF plasma CVD, with a substrate temperature of 300° C., and it was 1.5 μm thick. Crystalline photoelectric conversion layer 112 had a hydrogen content of 2.3 at. %, as obtained through secondary ion mass spectroscopy, and it had a (111) diffraction peak to (220) diffraction peak ratio in intensity of 0.084, as obtained through x-ray diffraction.

When the photoelectric conversion device of the first embodiment was illuminated with incident light 4 of AM1.5 with a light quantity of 100 mW/cm², its output characteristics were: an open-circuit voltage of 0.550V; a short-circuit current density of 22.5 mA/cm²; a fill factor of 76.8%; and a conversion efficiency of 9.50%.

SECOND TO FIFTH EXAMPLES AND FIRST AND SECOND COMPARATIVE EXAMPLES

In second to fifth examples and first and second comparative examples, silicon-based thin film photoelectric conversion devices were fabricated under the same condition as in the first example, except that Ag layer 102 serving as a light reflecting metal thin film was provided, with the substrate temperature and its deposition rate varied to allow Ag layer 102 to have a surface provided with various convexities and concavities. Resultant Ag layers 102 each had a surface textured with convexities and concavities having a level difference, a pitch and a pitch to level difference ratio, as shown in Table 1 together with various photoelectric conversion characteristics of the photoelectric conversion devices. It should be noted that Table 1 also provides the results of the first example.

TABLE 1

| No. | Level Difference Between Convexities and Concavities of Ag Film (nm) | Pitch of Convexities and Concavities of Ag Film (nm) | Pitch/ Level Difference | Open- Circuit Voltage (V) | Short- Circuit Current Density (mA/cm²) | Fill Factor (%) | Conversion Efficiency (%) |
| --- | --- | --- | --- | --- | --- | --- | --- |
| Example 1 | 40 | 700 | 17.5 | 0.550 | 22.5 | 76.8 | 9.50 |
| Example 2 | 81 | 700 | 8.6 | 0.498 | 23.2 | 74.9 | 8.65 |
| Example 3 | 32 | 700 | 21.8 | 0.511 | 21.1 | 75.9 | 8.18 |
| Example 4 | 38 | 505 | 13.2 | 0.530 | 22.2 | 76.1 | 8.95 |
| Example 5 | 58 | 435 | 7.5 | 0.501 | 23.9 | 75.5 | 9.04 |
| Comparative Example 1 | 125 | 100 | 0.8 | 0.462 | 21.0 | 74.5 | 7.22 |
| Comparative Example 2 | 20 | 700 | 35 | 0.508 | 18.5 | 76.0 | 7.14 |

Figure 5:
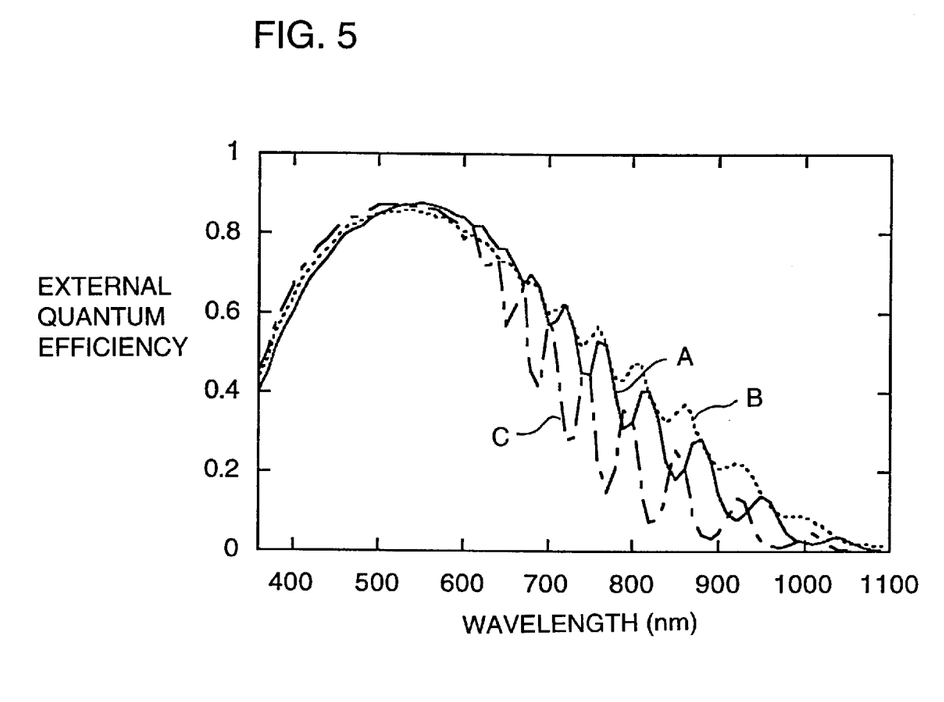
FIG. 5 is a graph of external quantum efficiency versus light wavelength for various photoelectric conversion devices according to the embodiments of the present invention.

The photoelectric conversion devices of the first to third examples each have a light absorption characteristic as shown in the FIG. 5 graph. More specifically, in this graph the horizontal axis represents light wavelength and the vertical axis represents each device's external quantum efficiency. The photoelectric conversion devices of the first, second and third examples have their respective spectral sensitivities as represented by a solid line curve A, a dotted line curve B and a chained line curve C, respectively. It should be noted that all the examples and the comparative examples each had crystalline photoelectric conversion layer 112 having a thickness set to be relatively thin, i.e., 1.5 μm, to increase the influence of light confinement in a longer wavelength range of 600 to 1000 nm for easy observation.

As is apparent from Table 1 and the FIG. 5 graph, as Ag layer 102 has a surface textured with convexities and concavities having a smaller pitch/level difference ratio, i.e., the layer has a surface provided with steeper convexities and concavities, in the longer wavelength region of 600 to 1000 nm a higher external quantum efficiency is achieved, which indicates an enhanced light confinement.

On the other hand, the open-circuit voltages in Table 1 do not necessarily match the tendency in spectral sensitivity characteristic represented in FIG. 5, and have relatively large values when Ag layer 102 has a surface provided with convexities and concavities having a pitch/level difference ratio in a range of approximately 10 to 20.

The first and second comparative examples have their respective Ag layers 102 having their surfaces provided with convexities and concavities having an extremely small pitch/ level difference ratio and an extremely large pitch/level difference ratio, respectively. In these comparative examples also, the second comparative example, having a surface provided with less steep convexities and concavities, achieves a higher open-circuit voltage. According to a result of measuring their receptive sensitivity characteristics similarly as in FIG. 5, however, the second comparative example confined less light than the first comparative example. Furthermore, although it is not yet known why, a surface having too steep convexities and concavities such as in the first comparative example was found to provide less light confinement than in the examples.

Thus, it is desirable that light reflecting metal thin film 102 have a surface provided with convexities and concavities to some extent to confine light in photoelectric conversion unit 11, but if such concavities and convexities have too large a level difference therebetween and convex portions and concave portions form acute angles therebetween, then photoelectric conversion unit 11 provided thereon would includes insufficient semiconductor junction portions, resulting in a reduced open-circuit voltage of the photoelectric conversion device of interest and a reduced yield thereof. Thus it can be found that there is an appropriate range for the parameter of the convexities and concavities on the surface of light reflecting metal film 102. More specifically, preferably, such convexities and concavities have therebetween a level difference in a range of 0.01 to 2 $\mu$m, with a pitch/level difference ratio of greater than one time and no more than 25 times, more preferably in a range of 4 to 20 times.

SIXTH EXAMPLE

Corresponding to the third embodiment of the present invention described with reference to FIG. 3, a tandem photoelectric conversion device was fabricated as a sixth example. In the sixth example, the tandem photoelectric conversion device had on glass substrate 1 elements 201 to 203 and 211 to 213, which correspond to elements 101 to 103 and 111 to 113 of the first example and were thus similarly provided, though crystalline silicon-based photoelectric conversion layer 212 had a set thickness of 3.0 $\mu$m. On a first unit 21 as a rear photoelectric conversion unit, a second unit 22 was further stacked as a front photoelectric conversion unit. The second photoelectric conversion unit 22 includes an n-type layer 221, an amorphous silicon-based photoelectric conversion layer 222 and a p-type layer 223 which are stacked successively. Amorphous photoelectric conversion layer 222 had a set thickness of 300 nm. On the second photoelectric conversion unit 22, transparent front electrode 2 and Ag electrode 3 in the form of a comb were provided, similarly as in the first embodiment.

When the amorphous-crystalline type, tandem, silicon-based thin film photoelectric conversion device of the sixth example was illuminated with incident light 4 of AM1.5 with a light quantity of 100 mW/cm$^2$, its output characteristics were: an open-circuit voltage of 1.42V; a short-circuit current density of 13.0 mA/cm$^{2-}$; a fill factor of 73.5%; and a conversion efficiency of 13.6%.

Thus, the present invention can provide a silicon-based thin film photoelectric conversion device achieving significant light confinement and providing a high open-circuit voltage and significantly reduce the cost of the photoelectric conversion device and enhance the performance of the device.

What is claimed is:

1. A silicon-based thin film photoelectric conversion device comprising a substrate, a back electrode having a light reflecting metal film, at least one silicon-based photoelectric conversion unit and a front transparent electrode, wherein at least one of said light reflecting metal film and said front transparent electrode has that surface thereof closer to said silicon-based photoelectric conversion unit provided with convexities and concavities having a level difference therebetween in a range of 0.01 to 2 $\mu$m and a pitch larger than said level difference and no more than 25 times said level difference, and the transparent electrode or back electrode, further from the substrate, has a smaller unevenness pitch as compared to the back electrode or transparent electrode, nearer to the substrate; and wherein at least one said photo electric conversion unit includes a first conductivity type layer, a crystalline silicon-based photoelectric conversion layer, and an opposite conductivity type layer; and wherein said crystalline silicon-based photoelectric conversion layer is formed, with a substrate temperature of no more than 400° C., and said crystalline silicon-based photoelectric conversion layer has a crystallized volume fraction of at least 80%, a hydrogen content in a range of 1 to 30 atomic %, a thickness in a range of 0.5 to 20 $\mu$m, a preferential crystal orientation plane of (110) parallel to a film surface thereof, and an x-ray diffraction intensity ratio of no more than 0.2 as a (111) diffraction peak to (220) diffraction peak ratio.

2. The silicon-based thin film photoelectric conversion device of claim 1, wherein said light reflecting metal film has that surface thereof closer to the silicon-based photoelectric conversion unit provided with concavities and convexities having a level difference therebetween in a range of 0.01 to 2 $\mu$m and a pitch larger than said level difference and no more than 25 times said level difference.

3. The silicon-based thin film photoelectric conversion device of claim 1, wherein said front transparent electrode has that surface thereof closer to the silicon-based photoelectric conversion unit provided with convexities and concavities having a level difference therebetween in a range of 0.01 to 2 $\mu$m and a pitch larger than said level difference and no more than 25 times said level difference.

4. The silicon-based thin film photoelectric conversion device of claim 1, wherein said light reflecting metal film and said front transparent electrode each have that surface thereof closer to the silicon-based photoelectric conversion unit provided with convexities and concavities having a level difference therebetween in a range of 0.01 to 2 $\mu$m and a pitch larger than said level difference and no more than 25 times said level difference.

5. The silicon-based thin film photoelectric conversion device of claim 1, wherein either one of said light reflecting metal film and said front transparent electrode has that surface thereof closer to the silicon-based photoelectric conversion unit provided with convexities and concavities representing curves substantially free of any acute protrusions.

6. The silicon-based thin film photoelectric conversion device of claim 1, wherein either one of said light reflecting metal film and said front transparent electrode has that surface thereof closer to the silicon-based photoelectric conversion unit provided with convexities and concavities representing curve substantially free of any bent points, at which slopes are discontinuously changed.

7. The silicon-based thin film photoelectric conversion device of claim 1, wherein said back electrode includes a transparent conductive oxide film arranged closer to the silicon-based photoelectric conversion unit.

8. The silicon-based thin film photoelectric conversion device of claim 7, wherein said back electrode includes a metal film having that interface with said transparent conductive oxide film and being formed of one selected from Ag, Au, Al, Cu and Pt or an alloy containing the same.

9. The silicon-based thin film photoelectric conversion device of claim 1, wherein said back electrode includes a metal film having a high reflectance to reflect no less than 95% of a light having a wavelength in a range of 500 to 1200 nm.

10. The silicon-based thin film photoelectric conversion device of claim 1, wherein said back electrode includes a metal film formed of one selected from Ag, Au, Al, Cu and Pt or an alloy containing the same.

11. The silicon-based thin film photoelectric conversion device of claim 1, wherein said silicon-based photoelectric conversion device is a tandem type including said crystalline silicon-based photoelectric conversion unit plus at least one amorphous photoelectric conversion unit including an amorphous silicon-based photoelectric conversion layer and stacked on the crystalline photoelectric conversion unit in tandem.

12. The silicon-based thin film photoelectric conversion device of claim 1, wherein a back electrode having a light reflecting metal film, at least one silicon-based photoelectric conversion unit, and front transparent electrode are stacked in this order on a substrate.

* * * * *

UNITED STATES PATENT AND TRADEMARK OFFICE
CERTIFICATE OF CORRECTION

PATENT NO.   : 6,388,301 B1                                                        Page 1 of 1
DATED        : May 14, 2002
INVENTOR(S)  : Yuko Tawada et al.

It is certified that error appears in the above-identified patent and that said Letters Patent is hereby corrected as shown below:

Title page,
Item [56], References Cited, FOREIGN PATENT DOCUMENTS, please insert the following references:

-- JP         A61-288314      12/1986
   JP         A59-61973       04/1984
   EP        0940857A1       08/1999
   EP        0793277A2       09/1997
   JP         A7263729        10/1995 --.

OTHER PUBLICATIONS, please insert the following references:

-- Sannomiya et al., IEEE, pp. 405-408 (1994).
Yang et al., Appl. Phys. Lett., Vol. 70, No. 22, pp. 2975-2977 (1997). --

Signed and Sealed this

Seventh Day of January, 2003

JAMES E. ROGAN
*Director of the United States Patent and Trademark Office*